Sept. 12, 1967 B. D. JAMES 3,341,649

MODULAR PACKAGE FOR SEMICONDUCTOR DEVICES

Original Filed Jan. 17, 1964

2 Sheets-Sheet 1

INVENTOR.
Brian David James

BY Flehr and Swain

Attorneys

INVENTOR.
Brian David James
BY [signature]
Attorneys

United States Patent Office 3,341,649
Patented Sept. 12, 1967

3,341,649
MODULAR PACKAGE FOR SEMICONDUCTOR DEVICES

Brian David James, Menlo Park, Calif., assignor to Signetics Corporation, Sunnyvale, Calif., a corporation of California Continuation of application Ser. No. 338,438, Jan. 17, 1964. This application Aug. 19, 1966, Ser. No. 573,722
6 Claims. (Cl. 174—52)

This application is a continuation of application Ser. No. 338,438, filed Jan. 17, 1964, now abandoned.

This invention relates to a modular package, and more particularly to a modular package for use with semiconductor devices.

With the advent of semiconductor devices including semiconductor integrated circuits with their very high reliability and potentially low cost, it has become necessary to re-evaluate existing assembly and packaging techniques to take full advantage of this new technology. Presently used packages, while seeking to take advantage of the savings in size and weight available with the use of integrated circuits, still make use of many of the techniques used for years in conventional transistor manufacture. For example, many integrated circuits are assembled in a multi-lead modification of TO-5 cans utilizing a process which is identical with that used in the manufacture of transistors. Greater packaging density may be obtained by using a modular package such as that disclosed in copending application Ser. No. 213,912, filed Aug. 1, 1962, now abandoned, which has been developed specifically for use with integrated circuits. However, even with such a modular package, there are several disadvantages. First of all, the formation of such a modular package is a multistep process which involves die attach, lead bond, lead weld and sealing steps which are relatively slow and costly. Moreover, the greatest mode failure of semiconductor devices, that of the bond between the fine gold connecting wires to the device or the Kovar leads, remains unaltered. A third disadvantage of any such package that mounts the device in a gas-filled cavity is that it has a reduced radiation resistance. This is because when the integrated circuit is encapsulated in a gas atmosphere and placed in a radiation field, the radiation will ionize the gas. The ions from the gas are attracted to the junctions of the device which have a high electric field when the junctions are reverse biased. The ions, therefore, are attracted to the junction and cause an inversion layer to form under the oxide resulting in a channel which destroys the effectiveness of the device. There is, therefore, a need for a new and improved modular package for use with semiconductor devices and particularly integrated circuits.

In general, it is an object of the present invention to provide a modular package for use with semiconductor devices which overcomes the above named disadvantages.

Another object of the invention is to provide a modular package of the above character in which the leads are bonded directly to the semiconductor device without any intervening wire connections.

Another object of the invention is to provide a modular package of the above character in which the semiconductor device is completely encapsulated in glass.

Another object of the invention is to provide a modular package which particularly lends itself to automation.

Another object of the invention is to provide a modular package which is relatively inexpensive and which can be economically and easily assembled.

Another object of the invention is to provide a modular package which is particularly radiation resistant.

Additional objects and features of the invention will appear from the following description in which the preferred embodiments are set forth in detail in conjunction with the accompanying drawings.

Referring to the drawings.

In general, the semiconductor device is completely encapsulated in a body of insulating material with the leads extending from the insulating material to provide a modular package. The semiconductor device can be encapsulated by utilizing two separate layers of insulating material having a relatively high melting temperature and an intermediate layer disposed between the other two layers and having a lower melting temperature which covers the integrated circuit and which binds the integrated circuit and the two layers into a unitary modular package. Alternatively, the semiconductor device can be molded in a body of insulating material with the leads extending therefrom.

Figure 1:
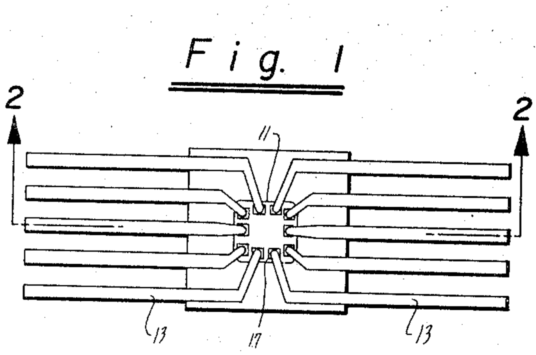
FIGURE 1 is a top plan view of a modular package for a semiconductor device such as an integrated circuit incorporating my invention with the top portion removed.
Figure 2:
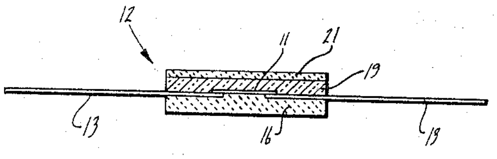
FIGURE 2 is a cross-sectional view taken along the line 2—2 of FIGURE 1 of the complete modular package.

As shown in FIGURES 1 and 2 of the drawings, my modular package consists of a semiconductor device such as an integrated circuit 11 encapsulated or molded within a body 12 of insulating material with leads 13 extending outwardly from the insulating material. The body of insulating material consists of a base plate or layer 16 formed of a suitable material such as a hard glass as, for example, Corning #7052 glass. The leads 13 are formed of any suitable conducting material which has substantially the same coefficient of expansion as that of the glass such as Kovar. The leads 13 may have any desired configuration in cross-section such as rectangular as shown in the drawings. The leads 13 are preferably embedded in the base plate or layer 16, by the use of heat and pressure, so that only the upper surfaces of the leads are exposed. This facilitates handling of the leads.

Figure 3:
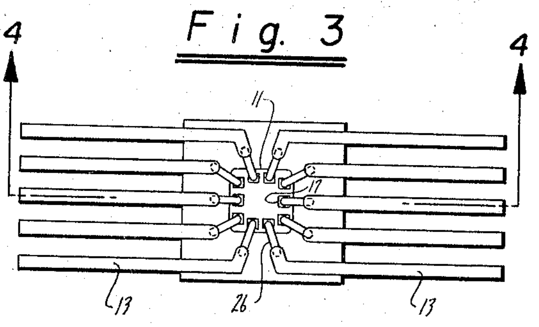
FIGURE 3 is a top plan view of another embodiment of my modular package with the top portion removed.

The integrated circuit 11 is of a conventional type well known to those skilled in the art and is provided with a plurality of pads 17 of a suitable material such as aluminum and which are disposed exclusively adjacent the outer margin of the semiconductor body 11 containing the integrated circuit as shown in FIGURES 1 and 3. As can be seen particularly from FIGURE 1, the leads 13 are arranged so that their extremities match the configuration and arrangement of the pads 17 on the integrated circuit 11. The leads 13 can be bonded to the pads 17 in any suitable manner as, for example, by the use of ultrasonic bonding techniques of the type described in copending application Ser. No. 213,912, filed Aug. 1, 1962. Thus, it can be seen that the leads 13 are bonded directly to the integrated circuit 11 without the use of intervening connecting wires as has been used with conventional packages. After the bonding has been accomplished, the entire integrated circuit and the leads 13 are embedded in a solid mass of insulating material as, for example, as layer 19 of glaze having a low melting temperature (at least somewhat lower than the melting temperature of the layer 16) which is disposed over the integrated circuit and the leads as shown particularly in FIGURE 2 and which is sandwiched between the base layer or plate 16 and a cover or upper layer 21. The cover or layer 21 is also formed of a suitable insulating material such as Corning #7052 glass having a melting temperature somewhat higher than that of the glaze 19.

After the module has been completed as shown in FIGURE 2, the entire module can be fired in a suitable furnace for a suitable period of time to cause the glaze 19 to bond together into a unitary structure the layers 16 and 21 with the integrated circuit 11 and the leads 13 encapsulated therein. As can be seen from the drawings, the integrated circuit is completely encapsulated so that there is no surrounding gaseous atmosphere in contact with the integrated circuit.

Figure 4:
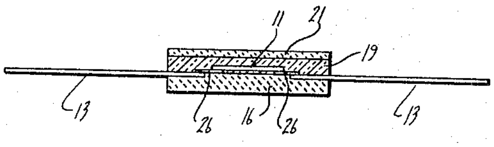
FIGURE 4 is a cross-sectional view taken along the line 4—4 of FIGURE 6 and of FIGURE 3.

A slightly modified modular construction is shown in FIGURES 3 and 4 which is very similar to that shown in FIGURES 1 and 2 with the exception that a thin aluminum film is deposited on the base or layer 16 in a manner well known to those skilled in the art to provide a plurality of connecting strips 26. It can be seen that the arrangement of the strips 26 is such that they connect the pads 17 of the integrated circuit 11 to the ends of the leads 13. In this embodiment, the pads 17 must be bonded to the strips 26 by suitable means such as ultrasonic bonding.

In the embodiment shown in FIGURES 3 and 4, the semiconductor device 11 is encapsulated between the layers 16 and 21 and the layer of glaze 19 which is sandwiched between the layers 16 and 21 so that no gaseous atmosphere is in contact with the semiconductor device.

Figures 5, 6:
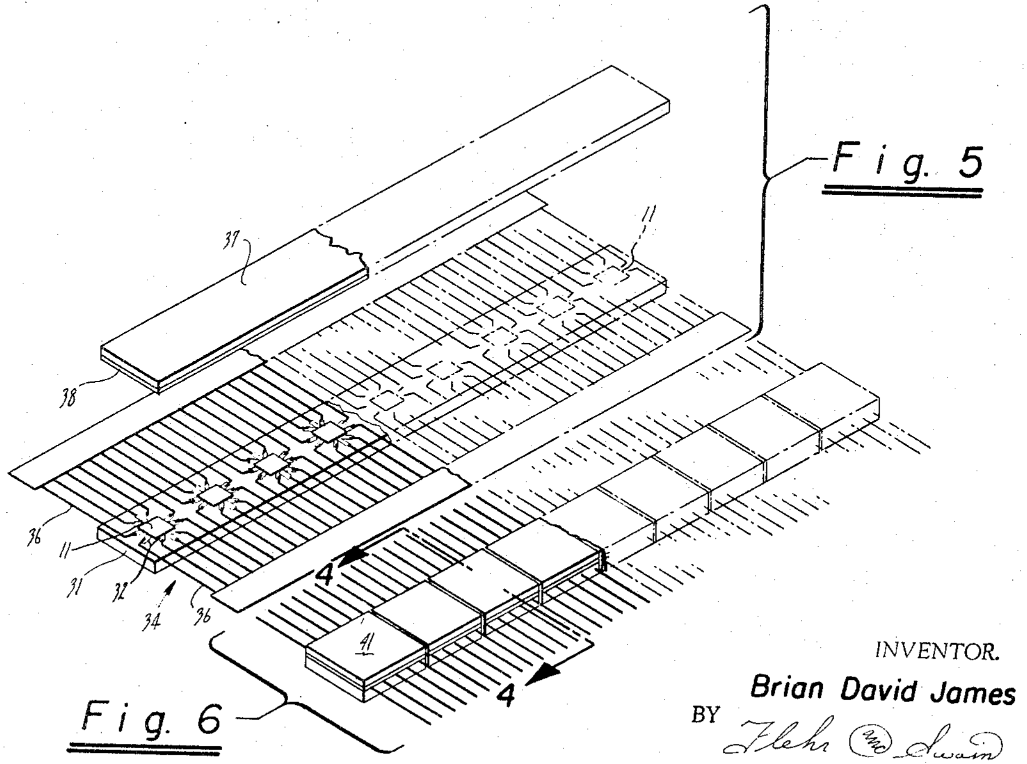
FIGURE 5 is an exploded isometric view showing the manner of assembly of a plurality of modular packages particularly adapted for quantity production and automation.
FIGURE 6 is an isometric view of the completed modular assembly showing the modular assembly cut into separate modular packages.

In FIGURES 5 and 6, there is shown a method of assembly whereby the modular package shown in FIGURES 1–4 can be economically and rapidly fabricated. To practice this method, an elongate plate 31 of suitable insulating material such as Corning #7052 glass is utilized. If the modular package of the type shown in FIGURES 3 and 4 is desired, thin film connecting strips 32 are deposited on one surface of the layer 31 in the desired arrangement. Thereafter, the semiconductor devices 11 are placed upon the layer 31 and have their pads 17 bonded to the connecting strips 32.

The connecting strips 32 connect the devices 11 to an electrode structure 34 having a plurality of arrays of leads 36. The arrays have a pattern with which the thin film strip connectors 32 register. An upper strip or layer 37 of a suitable insulating material such as Corning #7052 glass is then used. The under side of this strip or layer is provided with a layer 38 of insulating material having a lower melting temperature than the layers 31 and 37 such as a glaze. This strip 37 is placed over the strip or layer 31 and the entire assembly is then heated to a suitable temperature to cause the layer 38 to firmly adhere to the layer or strip 31 and to completely seal and bond the entire assembly into a unitary assembly. Thereafter, the completed assembly can be cut apart into individual modular packages 41 as shown in FIGURE 6.

By viewing of FIGURES 5 and 6, it can be seen that the method of assembly shown therein is particularly adapted for use for mechanized assembly or, in other words, automation. For example, continuous or very long strips of glass 31 can be mounted upon a conveyor in which the electrode structure with the arrays of leads 36 are bonded to the strip with each array having leads for one integrated circuit. The integrated circuit dice 11 are then bonded to the leads or, in the alternative, to the thin films deposited on the strip 31. The upper strip 37 with its glaze 38 can then be put in place and the entire assembly passed through a conveyor furnace which causes the glaze to bond together the strips 31 and 37 and to seal the integrated circuit dice 11. After passing through the furnace, the entire assembly can be stepped through an automatic final tester and thereafter sawn into individual packages and sorted.

The material used for bonding together the upper and lower layers and for encapsulating the semiconductor device should preferably be such that its temperature coefficient matches the material on which the semiconductor device is founded. For example, if silicon is used, it is preferably that it match the coefficient of expansion of silicon. However, it should be pointed out that my modular package works satisfactorily for wide temperature ranges even where there is a substantial temperature coefficient mismatch. For example, with present technology, it is very common to utilize aluminum films on semiconductor devices. Such films, as is well known to those skilled in the art, alloy with silicon at temperatures approximating 575° C. Therefore, utilizing my teaching to make the final seal in the modular package, it is necessary to utilize a glaze which will soften and seal below the 575° C. temperature. Glazes which melt below this temperature and which are presently known have temperature coefficients which do not match silicon or which do not match Kovar. However, I have found that it is possible to construct a modular package using such a low temperature glaze which will provide a completely sealed package which will operate satisfactorily over relatively wide temperature ranges. However, it can be readily seen that if metallizing other than aluminum is used and, for example, if higher temperature metallizing is used, it is possible to use higher temperature glazes to make the final seal without alloying the metallizing on the semiconductor device. The use of such higher temperature metallizing is desirable because the higher temperature glazes have temperature coefficients which closely approximate the temperature coefficient of silicon.

Figure 7:
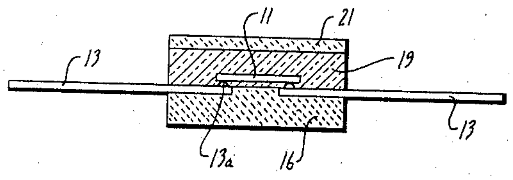
FIGURE 7 is a cross-sectional view similar to FIGURE 2 showing a modular package in which means is provided between the leads and the semiconductor device to facilitate making contact between the semiconductor device and the leads.

Another embodiment of my modular package is shown in FIGURE 7. It is very similar to the embodiment shown in FIGURE 2 with the exception that means is provided between the leads 13 and the semiconductor device 11 for facilitating the formation of electrical connections between the leads 13 and the pads 17 of the semiconductor device. In the embodiment shown in FIGURE 7, the inner extremities of the leads 13 have been provided with rounded raised portions 13*a*. These raised portions 13*a* facilitate the formation of a good electrical connection between the pads 17 and the raised portions 13*a* when bonding is accomplished by the use of ultrasonics or by the use of pressure and heat as is well known to those skilled in the art of thermocompression bonding. In addition to facilitating the formation of good electrical connections between the device 11 and the leads 13, the raised portions 13*a* also serve to raise the semiconductor device 11 off of the leads 13 so that the semiconductor device 11 cannot be accidentally shorted by shorting through the leads 13 or shorting around the edge of the insulating layer on the semiconductor device through the silicon below it.

The raised portions 13*a*, in addition to being formed as an integral part of the leads 13, can be formed onto the leads 13 after they have been embedded in the layer or base 16, and thereafter placing the raised portions 13*a* on the inner extremities of the leads 13 by suitable means such as electroplating. Alternatively, beads of a suitable material, such as gold, can be properly positioned and then the device 11 placed over the beads or balls. Thereafter, bonds can be formed simultaneously between the balls and the leads 13, and the balls and the pads 17 by suitable means such as ultrasonics.

Figure 8:
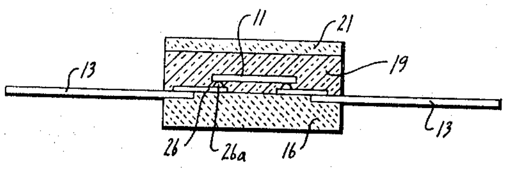
FIGURE 8 is a cross-sectional view similar to FIGURE 4 showing a modular package in which means is also provided between the leads and the semiconductor device to facilitate making contact between the semiconductor device and the leads.

Still another embodiment of my modular package is shown in FIGURE 8 which utilizes the same principles shown in FIGURE 7. Thus, in FIGURE 8, raised portions 26*a* have been provided on the connecting strips 26 to facilitate the formation of good electrical connections between the semiconductor device 11 and the connector strips 26. As explained above, these raised portions can be formed by electroplating or can be in the form of separate beads which are bonded to the connector strips and to the semiconductor device.

Figure 9:
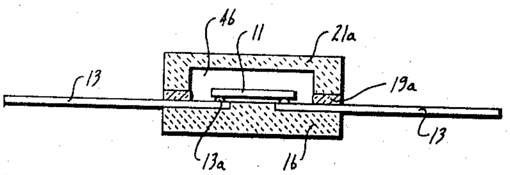
FIGURE 9 is a cross-sectional view of another embodiment of my modular package.

There may be situations in which it is undesirable to completely enclose the semiconductor device 11 within a glaze. In such a situation, a modular package of the type shown in FIGURE 9 can be utilized. The upper layer takes the form of a coffin-shaped lid 21*a* which is provided with a recess 46 that forms a space for the semiconductor device 11. In such a construction, the glaze 19*a* only forms a seal between the outer walls of the lid 21*a* and the outer margin of the base or lower layer 16. With such a construction, it can be seen that adequate space can be provided for the semiconductor device and that the semiconductor device is hermetically sealed and, in fact, can be hermetically sealed in an atmosphere of any desired type as, for example, an atmosphere of inert gas. The use of the modular package shown in FIGURE 9 may be particularly desirable in situations where it is difficult or impossible to obtain thermal temperature coefficients which match sufficiently closely to permit complete encapsulation of the semiconductor device.

Figure 10:
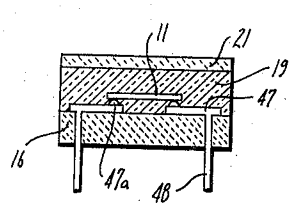
FIGURE 10 is a cross-sectional view of still another embodiment of my modular package.

In FIGURE 10, I have shown still another embodiment of my modular package in which connector strips 47 have been provided on the lower layer 16 in a manner similar to the manner in which the connector strips 26 are deposited in the previous embodiments. The connector strips are provided with raised portions 47*a* to facilitate formation of good electrical contacts with the pads provided on the semiconductor device 11. Leads 48 are provided which are connected to the connecting strips 47. However, as shown in FIGURE 10, the leads 48 extend in a direction which is perpendicular to the plane in which the connecting strips 47 lie rather than in a plane which is parallel to the connecting strips or to the surfaces of the base 16. Also, as shown, the leads 48 extend through the base 16 in a direction which is perpendicular to the surface of the base or lower layer 16 to thereby provide prongs which can be utilized in plug-in type packaging of electronic circuitry.

Figure 11:
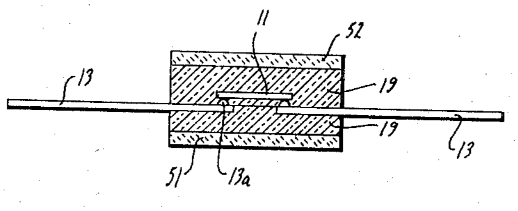
FIGURE 11 is a cross-sectional view of still another embodiment of my modular package incorporating heat sinks.

In certain applications, it is desirable to provide a heat sink in the modular package particularly in high power devices. Thus, in FIGURE 11, I have shown an embodiment of my modular package which includes heat sinks. For this purpose, I have provided upper and lower members 51 and 52 formed of a suitable material which will readily absorb heat and which will withstand high temperatures as, for example, a ceramic. One ceramic found to be suitable is aluminum oxide ($Al_2O_3$). As shown in FIGURE 11, the ceramic members 51 and 52 take the place of the members 16 and 26 in the embodiments hereinbefore described. The ceramic members 51 and 52 have one side coated with the glaze 19. The leads 13 are embedded in the glaze 19 on the member 51. The device 11 is then bonded to the leads 13 and thereafter the upper ceramic member 52 with the glaze thereon is placed over the member 51. The glaze 19 is then melted around the device 11 to completely encapsulate the device and to bond together the members 51 and 52 into a unitary assembly in which the device 11 is hermetically sealed therein. Since the members 51 and 52 are in relatively close proximity to the device 11, the members 51 and 52 will readily act as heat sinks to facilitate cooling of the device 11.

Although in the embodiment shown in FIGURE 11, both the upper and lower members 51 and 52 have been formed of a ceramic, if desired, only one of the members can be formed of a material which serves as a heat sink.

Figure 12:
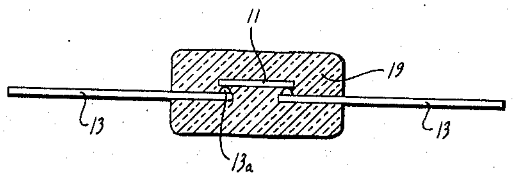
FIGURE 12 is a cross-sectional view of still another embodiment of my modular package.

A simpler embodiment of my modular package is shown in FIGURE 12 in which the leads 13 have been bonded to the device 11 and thereafter the device 11, with the leads 13 bonded thereto, are encapsulated by molding the device 11 and the leads 13 attached thereto in a body 19 formed entirely of glaze. Again, in this embodiment, the device is hermetically sealed in the body 19.

Figure 13:
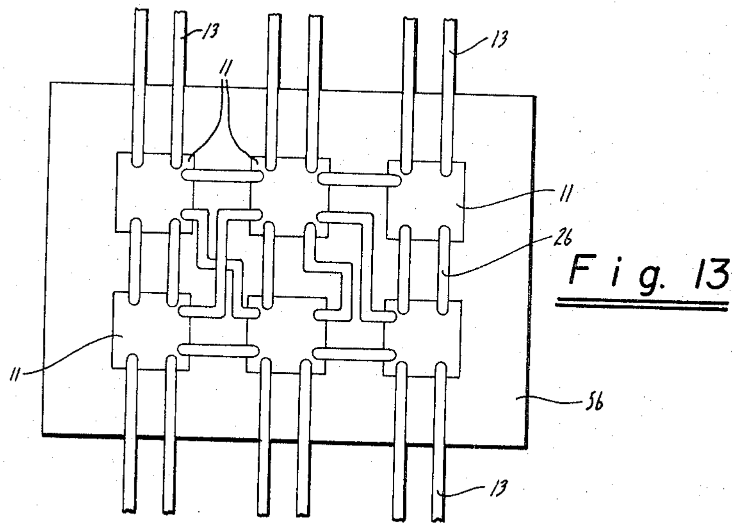
FIGURE 13 is a cross-sectional view in plan of an assembly in which a plurality of semiconductor devices are mounted upon a common support member.

Although in the embodiments of my modular package hereinbefore described, a single semiconductor device such as an integrated circuit has been encapsulated, it is readily apparent that the same teaching can be utilized when a number of semiconductor devices are used. For example, as shown in FIGURE 13, a plurality of the semiconductor devices 11 are interconnected by conducting strips 26 and connected to leads 13, and all are encapsulated within a body 56 formed in a manner similar to any of the embodiments hereinbefore described, the only difference being that a plurality of devices are being encapsulated rather than a single semiconductor device.

From the foregoing, it can be seen that I have provided a modular construction which particularly lends itself to semiconductor devices and which makes it possible to encapsulate more reliably. This is made possible by the elimination of the use of gold wires or other metal wires for making connections from the semiconductor devices to outside circuitry. As described in the foregoing embodiments, this is achieved primarily by the use of an upside-down bonding technique where the semiconductor device is directly bonded to the leads of the modular package without the use of any intervening fine gold or other metal wires. The modular package and method is also one which particularly lends itself to automated or semi-automated assembly to make it possible to fabricate such assemblies relatively inexpensively and rapidly. In addition, there is the advantage that the radiation resistance of the device is increased by providing an environment about the semiconductor device which is free or substantially free from gases. This increases the immunity of the device to gamma radiation which normally would ionize gases within close proximity to the device.

I claim:

1. In a modular package, a body formed of insulating material, a plurality of spaced metallic leads carried by the body and being insulated from each other, said leads having contact areas arranged in a pattern lying in a common plane within the confines of the body, the portions of said leads in contact with said body being carried by the body so that said leads are insulated from each other, a semiconductor body having an integrated circuit formed therein and having a plurality of metal pads connected to the integrated circuit and carried by the semiconductor body, and said contact pads being disposed exclusively adjacent the outer margin of the semiconductor body and lying in a common plane, and a plurality of connecting elements lying generally in a single plane formed of a thin metallic film supported by the body in direct and intimate contact with said contact areas, said semiconductor body being disposed so that said contact pads are in direct and intimate electrical contact with said connecting elements, said connecting elements extending exclusively in directions away from said semiconductor body, said connecting elements of thin film forming the sole means making electrical contact between the leads and said contact pads connected to said portions of said electrical circuit whereby electrical contact can be made to the integrated circuit through the leads.

2. A modular package as in claim 1 together with raised portions disposed between the contact pads and the connecting elements which serve to space the semiconductor body from the connecting elements.

3. A modular package as in claim 1 wherein said portions of said leads lie in a plane which is parallel to the plane in which the contact areas lie and in which the contact areas lie in a plane parallel to the plane in which the contact pads lie.

4. A modular package as in claim 1 wherein said portions of said leads lie in planes which are perpendicular to the plane in which the contact areas lie and the plane in which the contact pads lie.

5. A modular package as in claim 1 wherein said body completely encapsulates said semiconductor body so that solid matter is in contact with all surfaces of the semiconductor body and so that there is no surrounding gaseous atmosphere in contact with the integrated circuit carried by the semiconductor body.

6. A modular package as in claim 1 wherein at least a portion of the body is comprised of a ceramic element.

References Cited

UNITED STATES PATENTS

| | | |
|---|---|---|
| 2,971,138 | 2/1961 | Meisel et al. |
| 2,994,121 | 8/1961 | Shockely. |
| 3,072,832 | 8/1963 | Kilby. |
| 3,195,026 | 7/1965 | Wegner et al. |
| 3,220,095 | 11/1965 | Smith. |
| 3,239,719 | 3/1966 | Shower. |
| 3,264,712 | 8/1966 | Hayashi et al. |
| 3,271,625 | 9/1966 | Caracciolo. |

DARRELL L. CLAY, *Primary Examiner.*

LEWIS H. MYERS, *Examiner.*